United States Patent
Lee et al.

(10) Patent No.: US 8,524,539 B2
(45) Date of Patent: Sep. 3, 2013

(54) METHOD OF MANUFACTURING SEMICONDUCTOR PACKAGE

(75) Inventors: Hee-Jin Lee, Seongnam-si (KR); Joong-Hyun Baek, Suwon-si (KR)

(73) Assignee: SAMSUNG Electronics Co., Ltd., Suwon-si (KR)

( * ) Notice: Subject to any disclaimer, the term of this patent is extended or adjusted under 35 U.S.C. 154(b) by 121 days.

(21) Appl. No.: 13/210,607

(22) Filed: Aug. 16, 2011

(65) Prior Publication Data

US 2012/0045871 A1    Feb. 23, 2012

(30) Foreign Application Priority Data

Aug. 17, 2010  (KR) .................. 10-2010-0079462

(51) Int. Cl.
*H01L 21/00*    (2006.01)

(52) U.S. Cl.
USPC ........................... 438/122; 438/124; 438/127

(58) Field of Classification Search
USPC ................................. 438/124, 127, 122
See application file for complete search history.

(56) References Cited

U.S. PATENT DOCUMENTS

| | | | | |
|---|---|---|---|---|
| 5,851,337 A * | 12/1998 | Chen | ................ | 156/275.3 |
| 6,400,014 B1 * | 6/2002 | Huang et al. | ................ | 257/712 |
| 6,800,886 B2 * | 10/2004 | Awano | ................ | 257/276 |
| 7,399,658 B2 * | 7/2008 | Shim et al. | ................ | 438/106 |
| 7,608,915 B2 * | 10/2009 | Liao et al. | ................ | 257/675 |
| 7,723,759 B2 * | 5/2010 | Baskaran et al. | ................ | 257/276 |
| 7,875,970 B2 * | 1/2011 | Li | ................ | 257/706 |
| 2007/0205503 A1 * | 9/2007 | Baek et al. | ................ | 257/712 |
| 2009/0115037 A1 * | 5/2009 | How et al. | ................ | 257/675 |
| 2010/0059870 A1 * | 3/2010 | Wen et al. | ................ | 257/675 |
| 2011/0092027 A1 * | 4/2011 | Li | ................ | 438/122 |
| 2011/0272824 A1 * | 11/2011 | Pagaila | ................ | 257/777 |

FOREIGN PATENT DOCUMENTS

| | | |
|---|---|---|
| JP | 06-097326 | 4/1994 |
| JP | 06-132425 | 5/1994 |
| JP | 07-074287 | 3/1995 |
| KR | 10-2009-0074497 | 7/2009 |

* cited by examiner

*Primary Examiner* — Jarrett Stark
*Assistant Examiner* — John M Parker
(74) *Attorney, Agent, or Firm* — Stanzione & Kim, LLP

(57) ABSTRACT

Provided are a semiconductor package of a semiconductor chip, a semiconductor module, an electronic system, and methods of manufacturing the same. The method includes mounting a semiconductor chip on a package substrate, forming a molding member on the semiconductor chip, forming via holes penetrating the molding member to expose a portion of a top surface of the semiconductor chip, the via holes being arranged in a lattice shape in a plan view, and forming thermally conductive via plugs in the via holes.

18 Claims, 16 Drawing Sheets

METHOD OF MANUFACTURING SEMICONDUCTOR PACKAGE

CROSS-REFERENCE TO RELATED APPLICATIONS

This application claims priority under 35 U.S.C. §119(a) from Korean Patent Application No. 10-2010-0079462 filed on Aug. 17, 2010 in the Korean Intellectual Property Office, the disclosure of which is hereby incorporated by reference in its entirety.

BACKGROUND OF THE INVENTION

1. Field of the Invention

Embodiments of the present general inventive concept relate to a semiconductor package, semiconductor module, and electronic system of semiconductor chips, and methods of manufacturing the semiconductor package, semiconductor module, and electronic system.

2. Description of the Related Art

To prevent a semiconductor chip from being damaged by an external shock, the semiconductor chip may be sealed using an insulating material, such as an epoxy material. However, although the insulating material has a good insulation characteristic, because the insulating material has a low thermal conductivity, effectively dissipating heat generated in the semiconductor chip may be difficult.

SUMMARY OF THE INVENTION

Exemplary embodiments of the present general inventive concept provide an improved semiconductor package to provide heat dissipation.

Additional features and utilities of the present general inventive concept will be set forth in part in the description which follows and, in part, will be obvious from the description, or may be learned by practice of the general inventive concept.

Exemplary embodiments of the present general inventive concept provide a method of manufacturing an improved semiconductor package.

The exemplary embodiments of the present general inventive concept are not limited to those described herein, and other utilities and exemplary embodiments may become apparent to those of ordinary skill in the art based on the following descriptions.

Exemplary embodiments of the present general inventive concept can provide a method of manufacturing a semiconductor package including mounting a semiconductor chip on a package substrate, forming a molding member on the semiconductor chip, forming via holes penetrating the molding member to expose a portion of a top surface of the semiconductor chip, the via holes being arranged in a lattice shape in a plan view, and forming thermally conductive via plugs in the via holes.

Exemplary embodiments of the present general inventive concept can also provide a method of manufacturing a semiconductor package including mounting a semiconductor chip having a plurality of thermal pads on a package substrate, forming a molding member to cover the semiconductor chip on the package substrate, forming a plurality of holes in the molding member, at least one of the plurality of holes exposing the thermal pads, mounting thermally conductive materials on the plurality of holes, and reflowing the thermally conductive materials to fill the plurality of holes with thermally conductive via plugs.

Exemplary embodiments of the present general inventive concept can also provide a method of manufacturing a semiconductor package including preparing a package substrate having an upper conductive pad thereon, mounting a semiconductor chip having a thermal pad and a chip pad, electrically connecting the upper conductive pad with the chip pad via a connection member, encapsulating the semiconductor chip and the connection member using a molding member, forming a via plug penetrating the molding member to be directly in contact with the thermal pad, forming a sub-plug in the molding member not to be in contact with the thermal pad.

Exemplary embodiments of the present general inventive concept can also provide a semiconductor package including a package substrate, at least one semiconductor chip, with each semiconductor chip having a first surface on which thermal pads are disposed and a second surface adhered to the package substrate, a connection member configured to electrically connect the package substrate with the semiconductor chip, a molding member configured to cover the semiconductor chip and the connection member and expose the thermal pads through via holes; and thermally conductive plugs combined with the thermal pads to fill the via holes.

Exemplary embodiments of the present general inventive concept can also provide a semiconductor package, including a semiconductor chip disposed on a substrate, a molding member having via holes spaced at predetermined intervals, the molding member disposed on the semiconductor chip and the substrate, and a thermally conductive via plug disposed in the via holes.

In the semiconductor package, the semiconductor chip can be is at least one of a memory device and a non-memory device.

Exemplary embodiments of present general inventive concept may also provide a semiconductor module, including at least one semiconductor package disposed on a module substrate, the at least one semiconductor package having a semiconductor chip disposed on a substrate, a molding member having via holes spaced at predetermined intervals, the molding member disposed on the semiconductor chip and the substrate, and a thermally conductive via plug disposed in the via holes, and a plurality of module contact terminals to connect the at least one semiconductor package to an external electronic device.

In the semiconductor package, the semiconductor chip can be is at least one of a memory device and a non-memory device.

Exemplary embodiments of present general inventive concept may also provide a memory apparatus, including a non-volatile memory device having a memory semiconductor chip disposed on a substrate, a molding member having via holes spaced at predetermined intervals, the molding member disposed on the semiconductor chip and the substrate, and a thermally conductive via plug disposed in the via holes, and a controller to store and retrieve data from the non-volatile memory device when a command is received from a host device that is communicatively coupled to the memory apparatus.

Exemplary embodiments of present general inventive concept may also provide an electronic system, including an I/O (input/output) device to receive input and display external device via a communication bus, at least one of a memory device and a controller communicatively coupled to the communication bus, having a semiconductor chip disposed on a substrate, a molding member having via holes spaced at predetermined intervals, the molding member disposed on the semiconductor chip and the substrate, and a thermally conductive via plug disposed in the via holes, and an interface to communicatively couple the electronic system with a communications network.

BRIEF DESCRIPTION OF THE DRAWINGS

The foregoing and other features and utilities of the present general inventive concept will be apparent from the more particular description of preferred embodiments of the inventive concepts, as illustrated in the accompanying drawings in which like reference characters refer to the same parts throughout the different views. The drawings are not necessarily to scale, emphasis instead being placed upon illustrating the principles of the inventive concepts. In the drawings.

DETAILED DESCRIPTION OF THE PREFERRED EMBODIMENTS

Figure 1A:
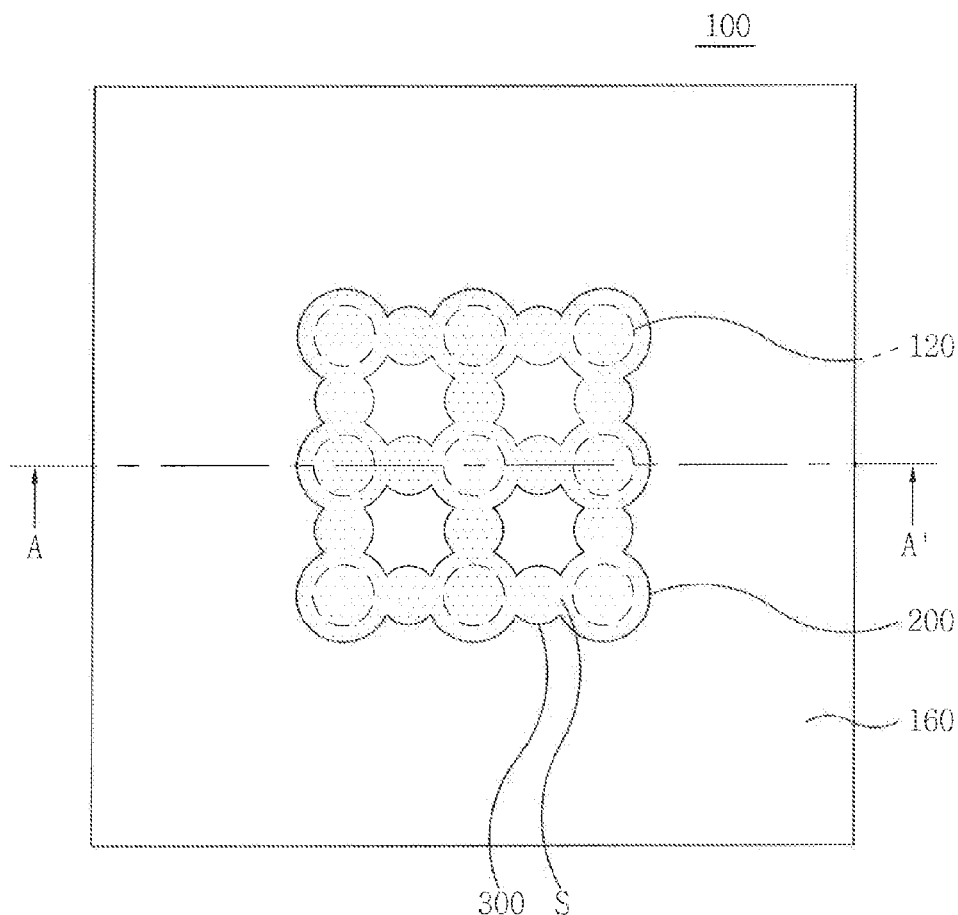
FIG. 1A illustrates a plan view of a semiconductor package of a semiconductor chip according to exemplary embodiments of the present general inventive concept.

Exemplary embodiments of the present general inventive concept will now be described more fully with reference to the accompanying drawings. The present general inventive concept may, however, be embodied in different forms and should not be construed as limited to the embodiments set forth herein. Rather, these embodiments are provided so that this disclosure is thorough and complete and fully conveys the scope of the inventive concept to those skilled in the art. In the drawings, the thicknesses of layers and regions may be exaggerated for clarity. When any element of the inventive disclosure appears in more than one drawing, it is denoted by the same reference numeral in each drawing.

Exemplary embodiments of the present inventive concept are described herein with reference to plan and cross-section illustrations that are schematic illustrations of idealized embodiments of the present inventive concept. As such, variations from the shapes of the illustrations as a result, for example, of manufacturing techniques and/or tolerances, are to be expected. Thus, exemplary embodiments of the present general inventive concept should not be construed as limited to the particular shapes of regions illustrated herein but are to include deviations in shapes that result, for example, from manufacturing. Thus, the regions illustrated in the figures are conceptual in nature and their shapes are not intended to illustrate the precise shape of a region of a device and are not intended to limit the scope of the present inventive concept.

Figure 1B:
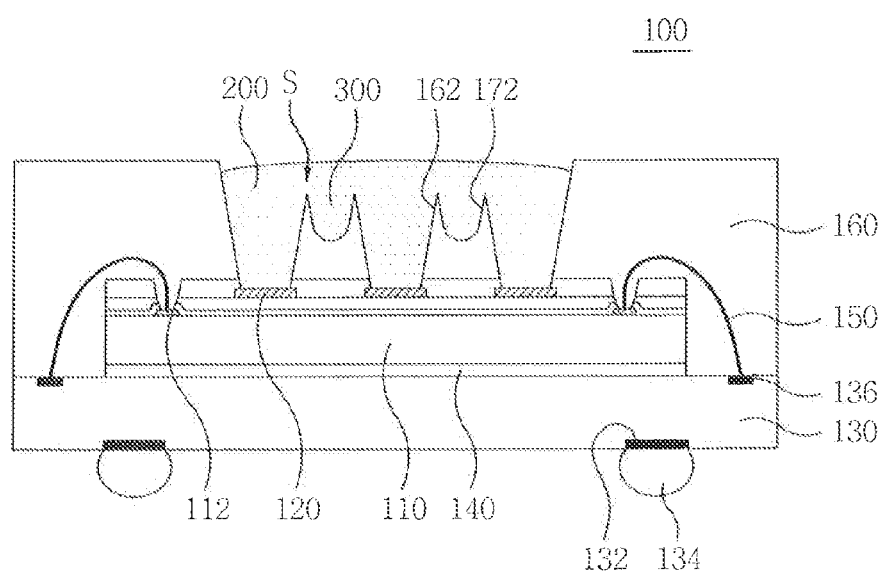
FIG. 1B illustrates a longitudinal sectional view taken along line A-A' of FIG. 1A.

FIG. 1A illustrates a plan view of a semiconductor package of a semiconductor chip according to exemplary embodiments of the present general inventive concept, and FIG. 1B illustrates a longitudinal sectional view taken along line A-A' of FIG. 1A.

Referring to FIGS. 1A and 1B, a semiconductor package 100 according to exemplary embodiments of the inventive concept may include a semiconductor chip 110, a package substrate 130 on which the semiconductor chip 110 is mounted, an adhesive member 140 to physically connect the semiconductor chip 110 and the package substrate 130, a connection member 150 to electrically connect the semiconductor chip 110 and the package substrate 130, a molding member 160 to protect the semiconductor chip 110 and the connection member 150 from an external shock (e.g., the molding member 160 minimizes an external shock to the semiconductor chip 110 and the connection member 150), and a thermally conductive via plug 200 to externally dissipate heat generated by the semiconductor chip 110.

FIGS. 2A, 2C, 2E, and 2G illustrate plan views of semiconductor chips according to exemplary embodiments of the inventive concept, and FIGS. 2B, 2D, 2F, and 2H illustrate longitudinal sectional views taken along lines a-a', b-b', c-c', and d-d' of FIGS. 2A, 2C, 2E, and 2G, respectively.

Figure 2A:
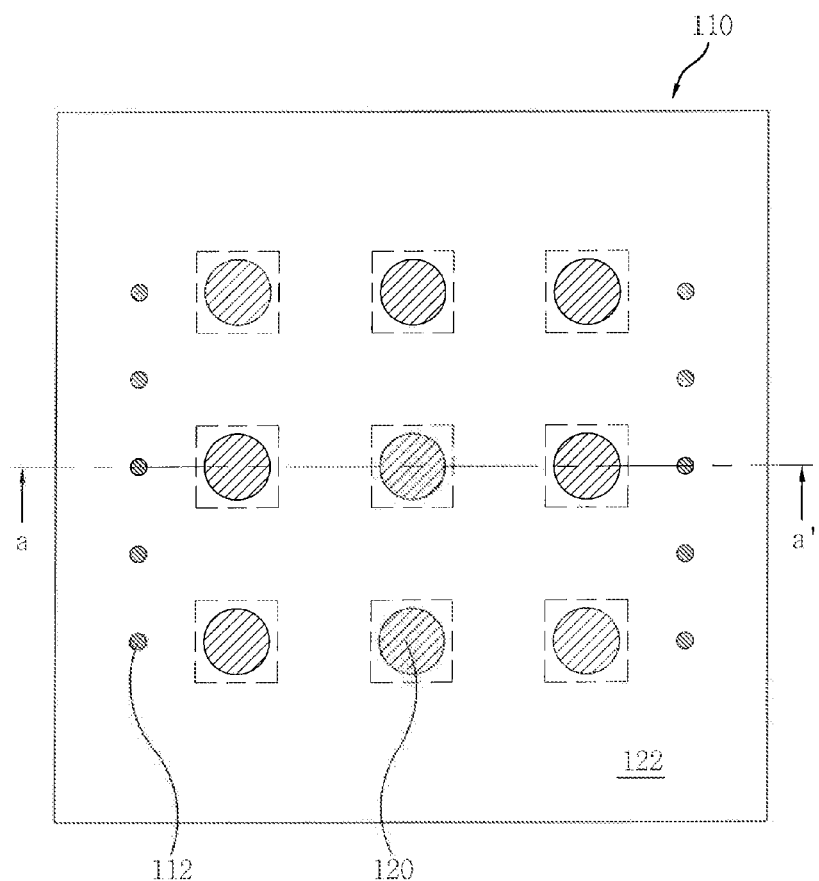
FIGS. 2A, 2C, 2E, and 2G illustrate plan views of semiconductor chips according to exemplary embodiments of the present general inventive concept.
Figure 2B:
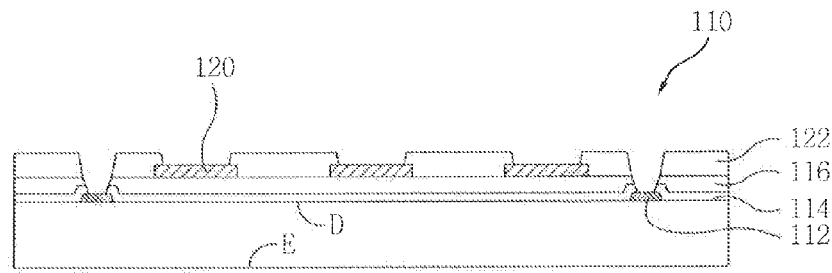
FIGS. 2B, 2D, 2F, and 2H illustrate longitudinal sectional views taken along lines a-a', b-b', c-c', and d-d' of FIGS. 2A, 2C, 2E, and 2G, respectively.

Referring to FIGS. 2A and 2B, the semiconductor chip 110 may include a memory or non-memory semiconductor chip fabricated by an ordinary wafer fabrication process. The semiconductor chip 110 may refer to a semiconductor chip on which a sawing process, a type of semiconductor manufacturing process, has already been performed. The semiconductor chip 110 may include a first surface D and a second surface E disposed on the opposite side thereof. That is, the first surface D of the semiconductor chip may be disposed on a side opposite of the second surface E. The first surface D may be an activated surface corresponding to a top surface of a semiconductor substrate (e.g., the semiconductor substrate 113a illustrated in FIG. 2I) on which a semiconductor circuit (e.g., semiconductor circuit 113b illustrated in FIG. 2I) is formed, and the second surface E may be an inactivated surface. For example, the semiconductor chip 110 may include at least one semiconductor circuit, which may be at least one of a signal processing circuit, a signal amplification circuit, a data transceiver circuit, a data input/output (I/O) circuit, a data memory circuit, and/or a power supply circuit.

The semiconductor chip 110 may include chip pads 112 and a first passivation layer 114. The chip pads 112 may be disposed on an outer portion of the first surface D using an ordinary wafer fabrication process, and the first passivation layer 114 may cover the first surface D and expose the chip pads 112. The semiconductor chip 110 may include a first buffer layer 116, thermal pads 120, and a second buffer layer 122. The first buffer layer 116 may cover the first passivation layer 114, the thermal pads 120 may be disposed on the first buffer layer 116, and the second buffer layer 122 may cover the first buffer layer 114 and expose the chip pads 112 and the thermal pads 120. The thermal pads 120 may be used to physically adhere the semiconductor chip 110 with thermally conductive via plugs 200. The chip pads 112 may be electrically connected to the package substrate 130 by the connection member 150.

Figure 2C:
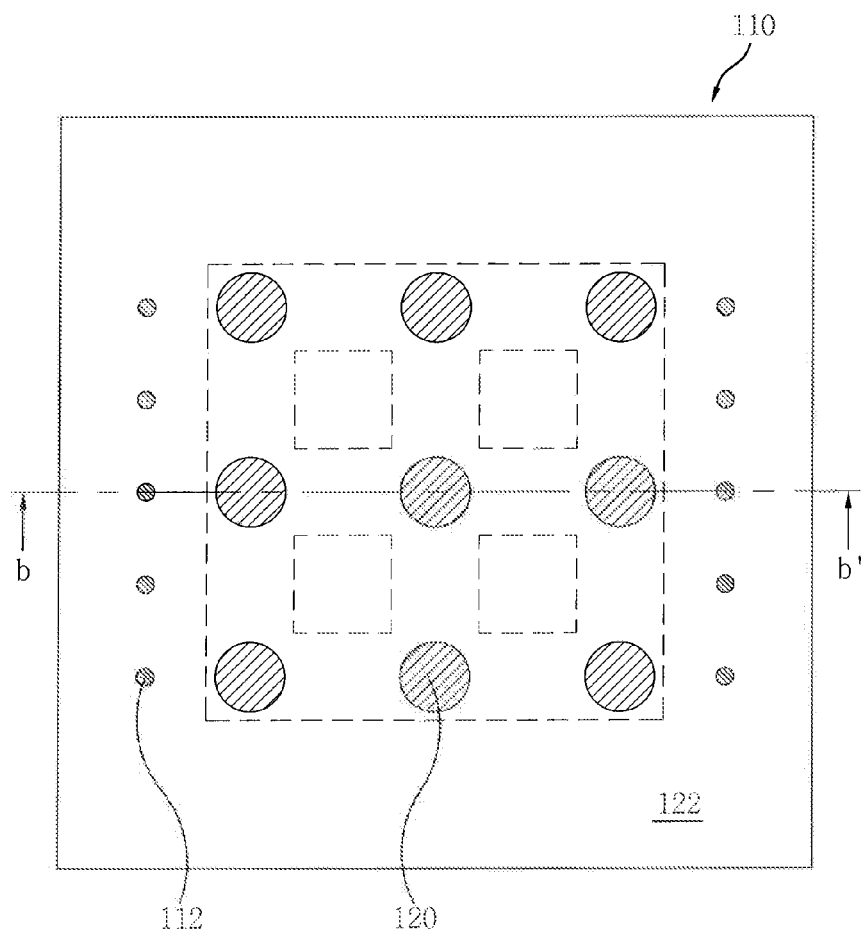
Figure 2D:
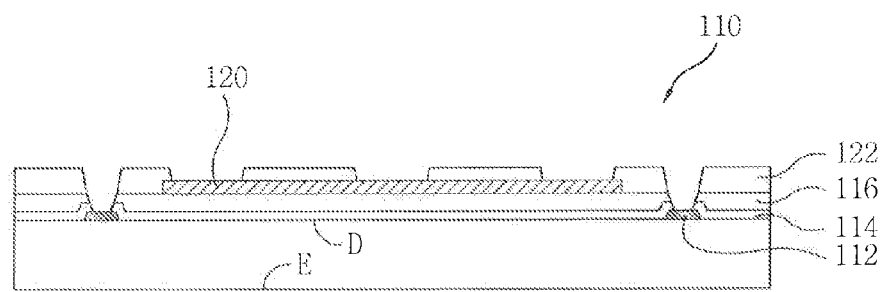

Referring to FIGS. 2C and 2D, the semiconductor chip 110 may include an integrally connected thermal pad 120. For example, the thermal pad 120 may have a plurality of regions, which may be exposed by the second buffer layer 122 and arranged in a lattice or island shape. A single mesh-type thermal pad 120 may be arranged under the second buffer layer 122. In the case of the semiconductor chip 110 of FIGS. 2A and 2B, since the thermal pads 120 arranged under the second buffer layer 122 correspond to regions of the thermal pads 120 exposed by the second buffer layer 122, the thermal pads 120 may exchange heat with one another within a limited range. Conversely, when the thermal pads 120 are integrally connected as illustrated in FIGS. 2C and 2D, the thermal pads 120 may be a heat transmission path so that the thermal pads 120 may exchange heat with one another more actively. A contact area between the thermal pads 120 and the first surface D of the semiconductor chip 110 may be increased, thereby improving and/or increasing heat dissipation.

Figure 2E:
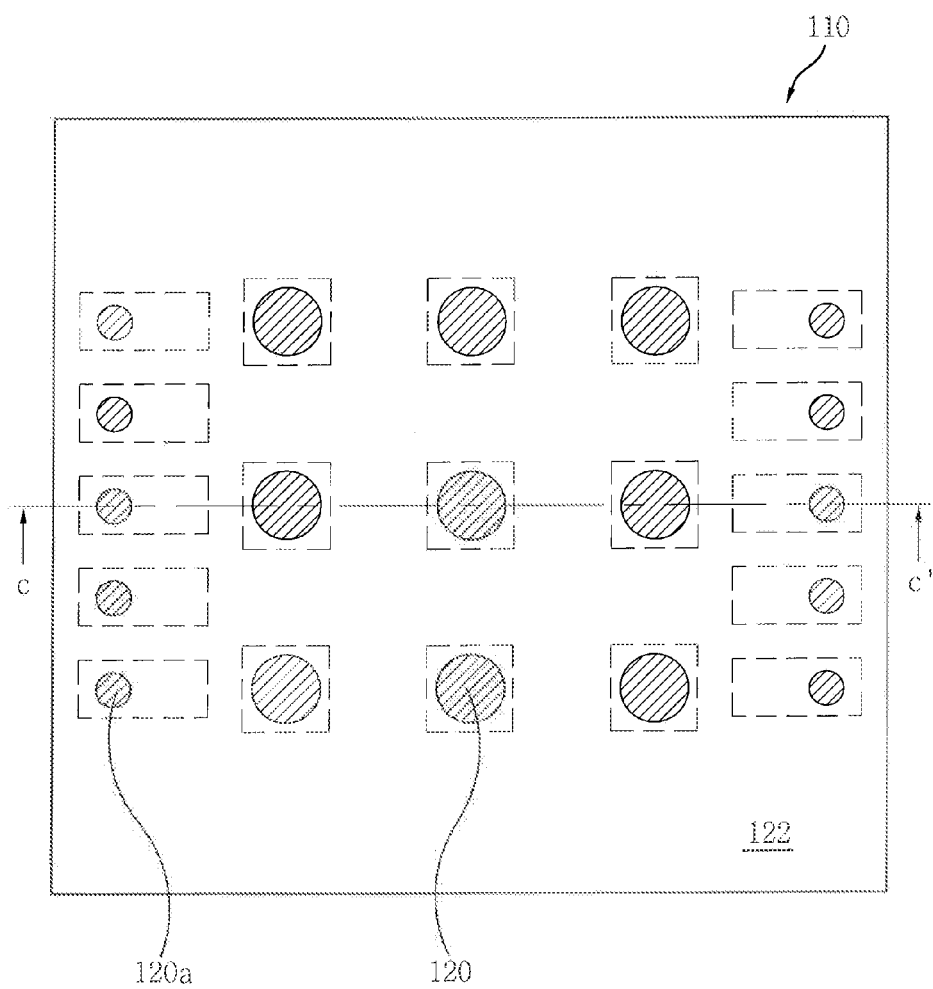
Figure 2F:
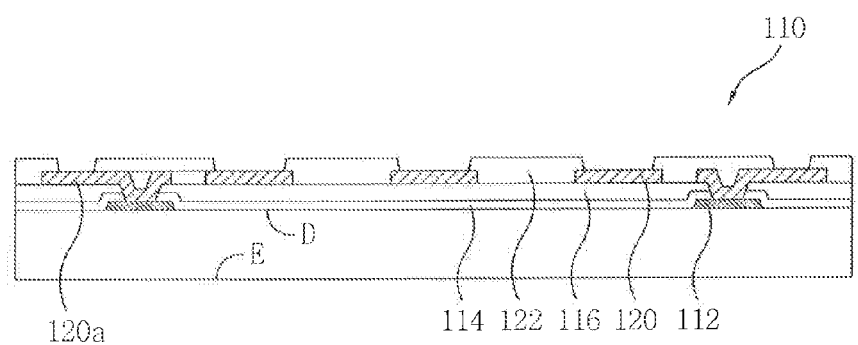

Referring to FIGS. 2E and 2F, the semiconductor chip 110 may include re-distribution pads 120a disposed at the same level as the thermal pads 120. Although the thermal pads 120 may be structurally similar to ordinary re-distribution pads, the thermal pads 120 may be distinguished from the re-distribution pads 120a. For example, to control intervals between or positions of I/O terminals, the re-distribution pads 120a may function to rearrange the I/O terminals. In this case, the I/O terminals may include, for example, a signal pad terminal configured to transmit and output electric signals to and from the semiconductor circuit, a power pad terminal configured to supply power to the semiconductor circuit, or a ground pad terminal configured to ground the semiconductor circuit. In comparison, the thermal pads 120 may be electrically insulated from the I/O terminals. In this case, the semiconductor chip 110 and the thermally conductive via plugs 200 may be thermally connected to each other. However, the exemplary embodiments of the present general inventive concept do not exclude a case where the thermal pads 120 are wholly or selectively connected to the I/O terminals to dissipate heat transmitted from the I/O terminals.

Figure 2G:
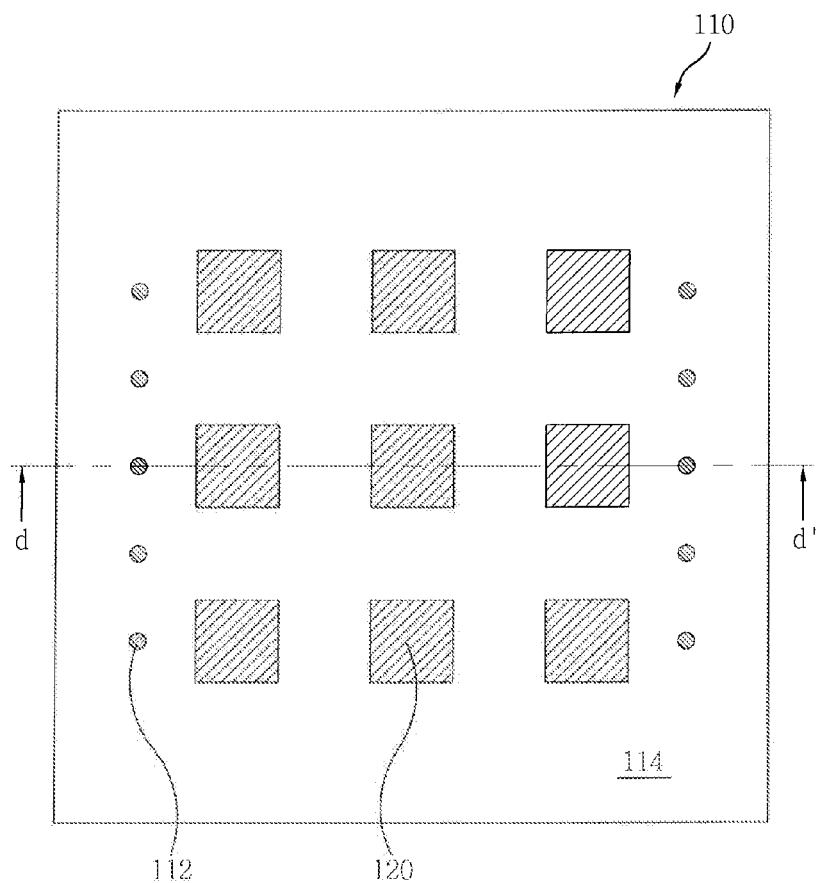
Figure 2H:
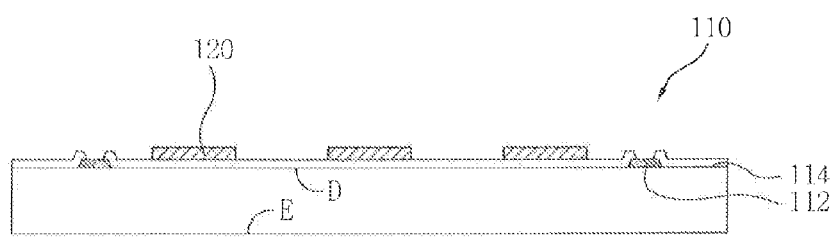
Figure 2I:
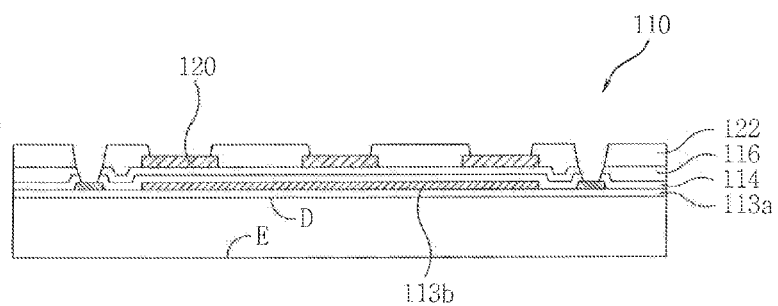
FIG. 2I illustrates the semiconductor chip of FIG. 2B including a semiconductor substrate and a semiconductor circuit according to exemplary embodiments of the present general inventive concept.

Referring to FIGS. 2G and 2H, the semiconductor chip 110 may include chip pads 112 and a first passivation layer 114, which may be formed using an ordinary wafer manufacturing process. The chip pads 112 may be formed on an outer portion of the first surface D of the semiconductor chip 110, and the first passivation layer 114 may cover the first surface D and expose the chip pads 112. The semiconductor chip 110 may include the thermal pads 120 disposed on the first passivation layer 114. Since the thermal pads 120 adhere the semiconductor chip 110 to the thermally conductive via plugs 200, the thermal pads 120 may not include the first and second buffer layers 116 and 122 (e.g., unlike in the previous exemplary embodiments discussed above in connection with FIGS. 2E-2F). For example, since the molding member 160 is formed on an edge of each of the thermal pads 120, the thermal pads 120 may be fixed by the molding member 160.

Figure 2J:
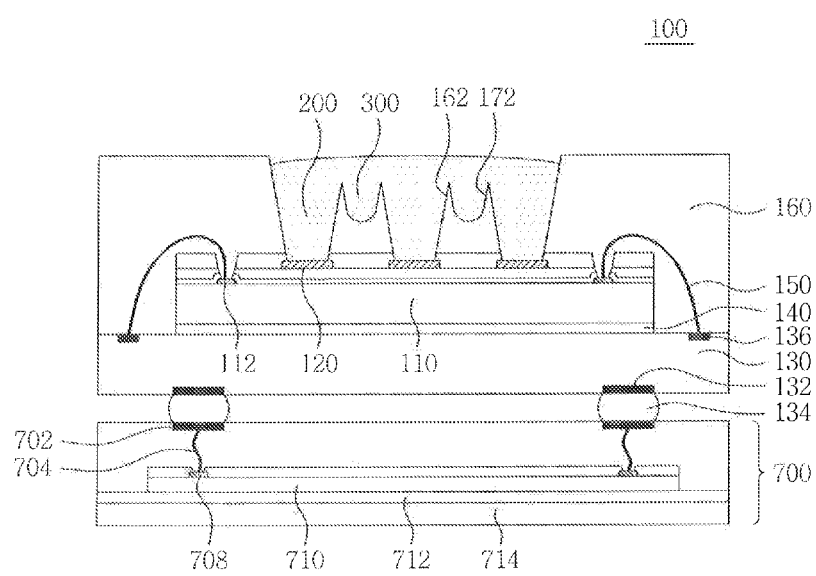
FIG. 2J illustrates the semiconductor package of FIG. 1B electrically connected to a semiconductor package via solder balls according to exemplary embodiments of the present general inventive concept.

Referring back to FIGS. 1A and 1B, the package substrate 130 may include a printed circuit board (PCB). A lower conductive pad 132 may be formed on one side of a bottom surface of the package substrate 130. A solder bump 134 for an external circuit (e.g., semiconductor package 700 as illustrated in FIG. 2J) may be attached to the lower conductive pad 132. The solder bump 134 for the external circuit may electrically connect the package substrate 130 to the external circuit. An upper conductive pad 136 may be formed on one side of a top surface of the package substrate 130. The upper and lower conductive pads 136 and 132 may be electrically connected to each other by a through electrode (not illustrated) formed through the package substrate 130.

FIG. 2J illustrates an external circuit (e.g., semiconductor package 700) that is electrically connected to the semiconductor package 100 via the solder bumps 134. The semiconductor package 700 can include conductive pads 702, connection member 704, and semiconductor chip 710. The semiconductor chip 710 can include chip pads 708 that are electrically connected to the conductive pads 702 via the connection member 704, and an adhesive layer 712 that can couple the semiconductor chip 710 to a substrate 714. The semiconductor chip 710 can be a memory or non-memory device.

Referring to FIGS. 1A and 1B, the adhesive member 140 may include a liquid adhesive or a solid adhesive sheet. The connection member 150 may include a metal line or bonding wire to electrically connect the semiconductor chip 110 and the package substrate 130. The molding member 160 may include a resin-based mixture or EMC.

The molding member 160 may include via holes 162 formed through the molding member 160 to expose the thermal pads 120. Thermally conductive plugs 200 may be formed in the via holes 162 and form contacts along with the thermal pads 120. The via plugs 200 may have a tapered shape such that outer diameters of the via plugs 200 decrease downward from a top surface of the molding member 160 to the thermal pads 120.

The semiconductor package 100 may include thermally conductive sub-plugs 300, which may be disposed between the via plugs 200 so as to not form contacts along with the thermal pads 120. The sub-plugs 300 may function as bridges to connect the via plugs 200, thereby increasing and/or expanding a heat dissipation path of the via plugs 200. The sub-plugs 300 may be formed, for example, only to a predetermined depth of the molding member 160. That is, the sub-plugs 300 may have a smaller volume than the via plugs 200.

Like the via plugs 200, the sub-plugs 300 may have a tapered shape such that outer diameters of the sub-plugs 300 decrease downward (e.g., towards the first surface D). Thus, the sub-plugs 300 may partially overlap and be connected to the via plugs 200. Upper portions of the molding member 160 disposed at connections S (as illustrated in FIG. 1A) where the via plugs 200 overlap the sub-plugs 300 may be at a lower level than the top surface of the molding member 160. As a tapered extent of the sub-plugs 300 increases, a probability that the sub-plugs 300 overlap the via plugs 200 may also increase.

Thus, when heat dissipation is attempted by connecting the via plugs 200 using the sub-plugs 300, an area occupied by the via plugs 200 and the sub-plugs 300 in the entire area of the molding member 160 may be increased, thereby increasing and/or improving a heat dissipation effect.

Figure 3A:
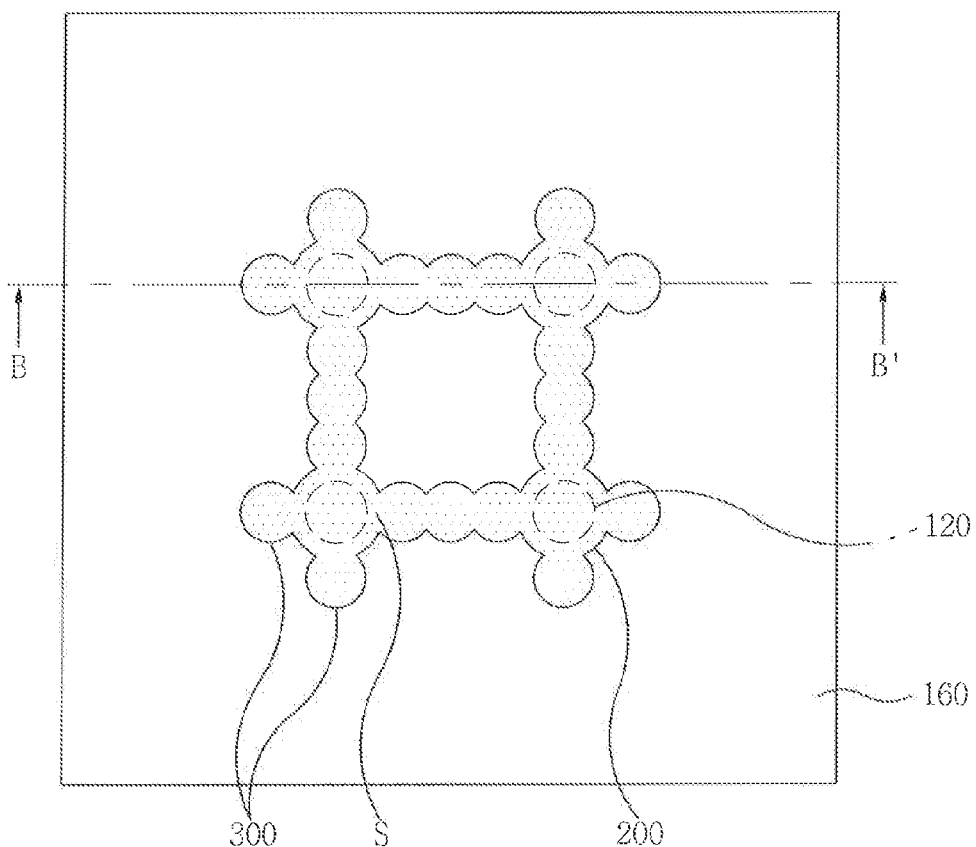
FIG. 3A illustrates a plan view of a semiconductor package according to exemplary embodiments of the present general inventive concept.
Figure 3B:
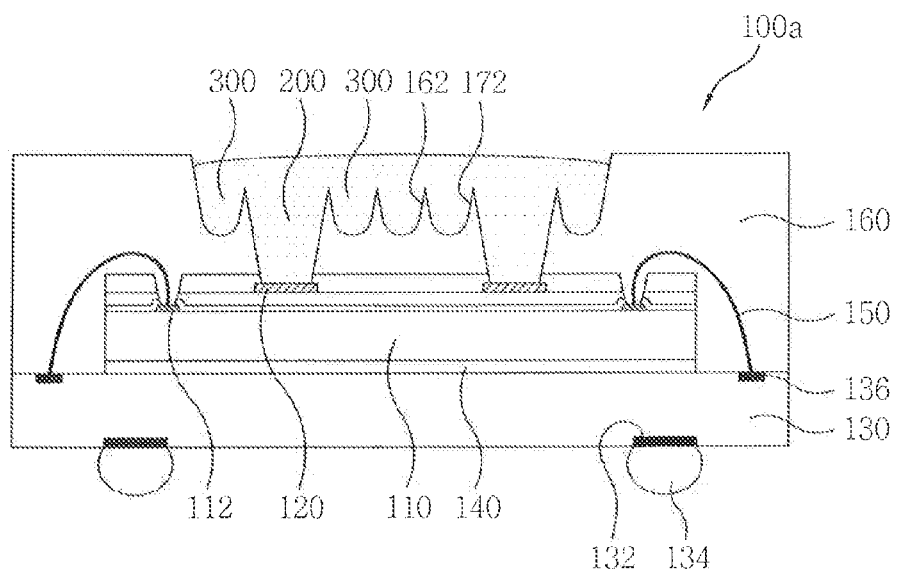
FIG. 3B illustrates a longitudinal sectional view taken along line B-B' of FIG. 3A.

FIG. 3A illustrates a plan view of a semiconductor package according to exemplary embodiments of the present general inventive concept, and FIG. 3B illustrates a longitudinal sectional view taken along line B-B' of FIG. 3A. As the exemplary embodiments illustrated in FIGS. 3A-3B are similar to the exemplary embodiments illustrated in FIGS. 1A-2H, only differences therebetween will now be described.

Referring to FIGS. 3A and 3B, a semiconductor package 100a according to exemplary embodiments of the present general inventive concept may include a plurality of sub-plugs 300 disposed between via plugs 200. When a distance between a pair of adjacent thermally conductive via plugs 200 is less than the outer diameter of the via plugs 200, the adjacent thermally conductive via plugs 200 may be bridged by a single sub-plug 300. However, when the distance between the pair of adjacent via plugs 200 is greater than the outer diameter of the via plugs 200, the adjacent via plugs 200 may be bridged by a plurality of sub-plugs 300. In this case, the plurality of sub-plugs 300 may overlap one another and be bridged.

When the plurality of sub-plugs 300 are used as described above, even if the number of thermal pads 120 is reduced, about the same heat dissipation effect may be expected as when a large number of thermal pads 120 is used. Thus, a heat dissipation effect may be obtained using a minimum number of thermal pads 120.

Figure 4A:
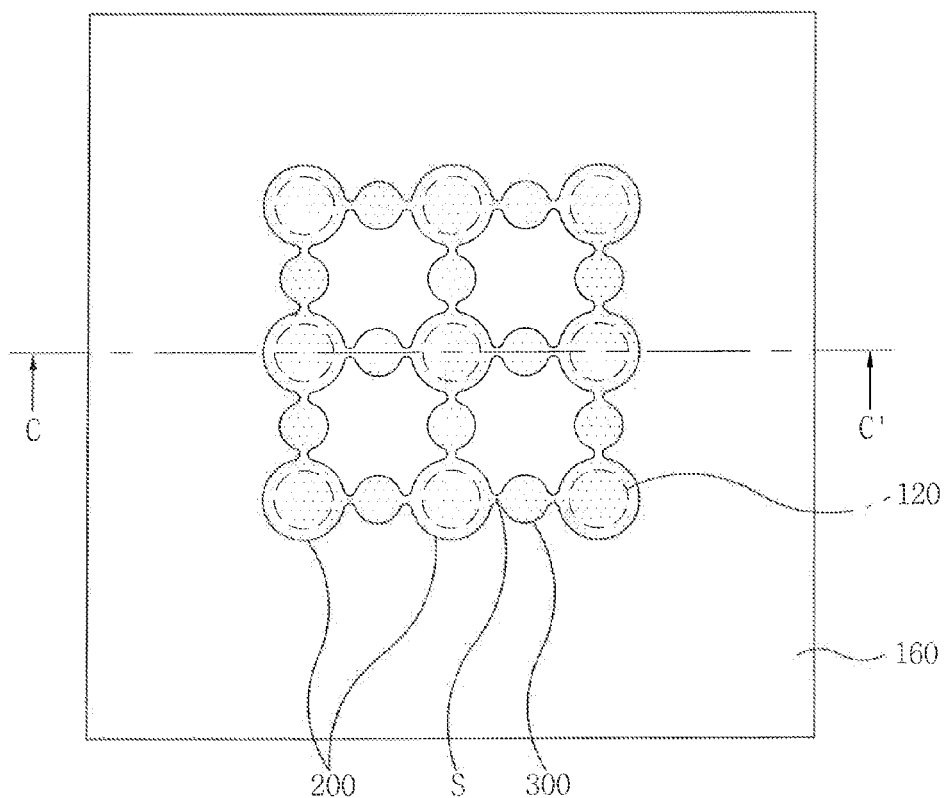
FIG. 4A illustrates a plan view of a semiconductor package according to exemplary embodiments of the present general inventive concept.
Figure 4B:
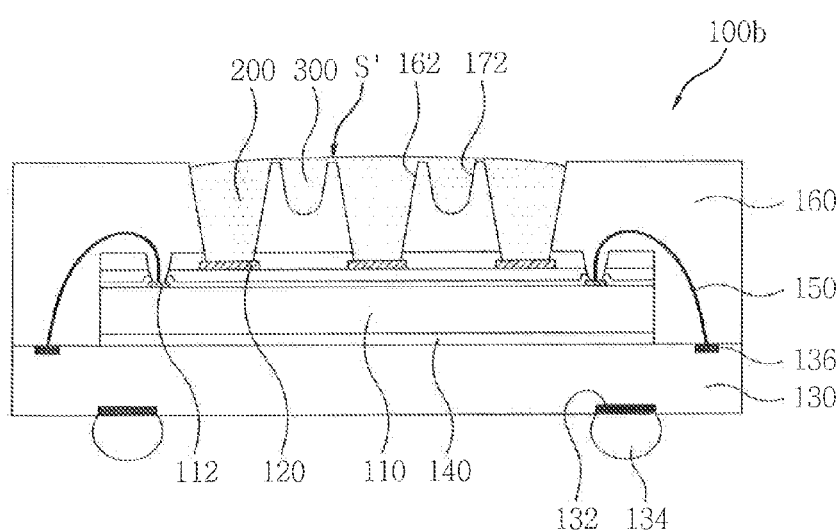
FIG. 4B illustrates a longitudinal sectional view taken along line C-C' of FIG. 4A.

FIG. 4A illustrates a plan view of a semiconductor package according to exemplary embodiments of the present general inventive concept, and FIG. 4B illustrates a longitudinal sectional view taken along line C-C' of FIG. 4A. Since the exemplary embodiments of the present general inventive concept illustrated in FIGS. 4A-4B is similar to the exemplary embodiments illustrated in FIGS. 1A-2H, only differences therebetween will now be described.

Referring to FIGS. 4A and 4B, in a semiconductor package 100b according to exemplary embodiments of the present general inventive concept, a thermally conductive sub-plug 300 may be bridged between a pair of adjacent thermally conductive via plugs 200, but a via hole 162 and a sub-hole 172 may not overlap each other. However, even though the via hole 162 and the sub-hole 172 do not overlap each other, the via plug 200 filling the via hole 162 may be connected to the sub-plug 300 filling the sub-hole 172 by a connection S'.

This is because the via plug 200 and the sub-plug 300 are adhered to each other in a liquid state due to a cohesive force or a surface tension before they are cooled and solidified. That is, since liquid molecules of the same kind tend to attract one another, the via plug 200 and the sub-plug 300 may naturally have a connection S' therebetween.

Figure 5A:
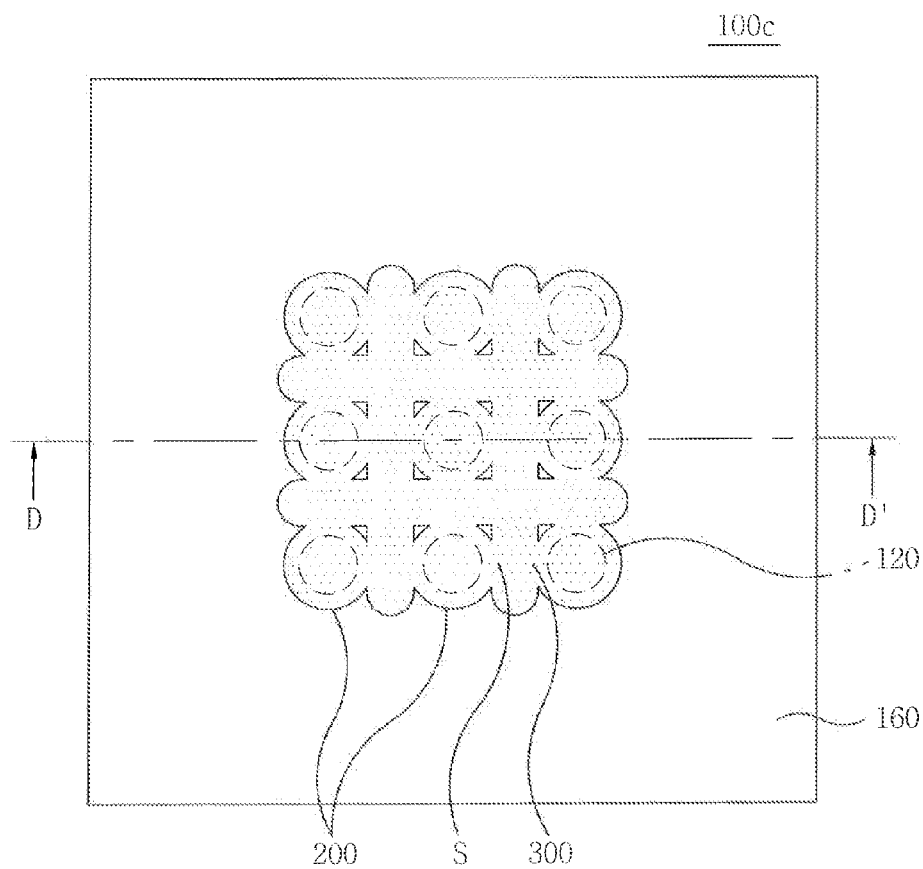
FIG. 5A illustrates a plan view of a semiconductor package according to exemplary embodiments of the present general inventive concept.
Figure 5B:
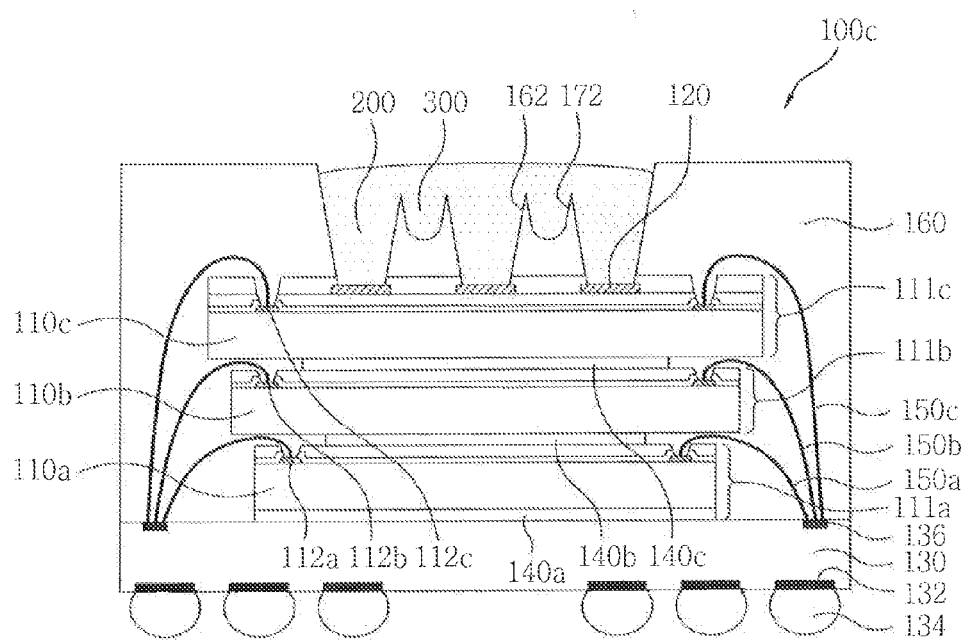
FIG. 5B illustrates a longitudinal sectional view taken along line D-D' of FIG. 5A.

FIG. 5A illustrates a plan view of a semiconductor package according to exemplary embodiments of the present general inventive concept, and FIG. 5B illustrates a longitudinal sectional view taken along line D-D' of FIG. 5A. Since the exemplary embodiments of the present general inventive concept illustrated in FIGS. 5A-5B is similar to the exemplary embodiments illustrated in FIGS. 1A-2H, only differences therebetween will now be described.

Referring to FIGS. 5A and 5B, a semiconductor package 100c according to exemplary embodiments of the present general inventive concept may be a system-in-package in which a plurality of semiconductor chips 110a, 110b, and 110c having the same and/or different functions are disposed on a single package substrate 130 and sealed. The semiconductor chip 110a may be included in lower package 111a, and the semiconductor chips 110b and 110c may be respectively included in upper packages 111b and 111c. The semiconductor package 100c may include a package substrate 130 and a lower package 111a disposed on the package substrate 130. A non-memory semiconductor chip 110a may be stacked on the lower package 111a. An upper package (e.g., upper package 111b and/or 111c) may be disposed on the lower package 111a. Memory semiconductor chips 110b and 110c may be stacked on the upper package. Although memory semiconductor chips 110b and 110c, as well as non-memory semiconductor chip 110a, are illustrated in FIG. 5B, this is merely an example, and the semiconductor chips 110a, 110b, and 110c may be any combination of memory and/or non-memory semiconductor chips (including the combinations of all chips 110a-110c as memory chips, and chips 110a-110c as non-memory chips). A molding member 160 may seal the upper and lower packages. That is, the molding member 160 may seal the lower package 111a and the upper packages 111b-111c. Each of the upper and lower packages (e.g., packages 111a, 111b, and 111c) may be a multi-chip package (MCP) in which a plurality of semiconductor chips are stacked or include a single semiconductor chip.

Lower conductive pads 132 may be formed on one side of a bottom surface of the package substrate 130. Solder bumps 134 for an external circuit may be attached to the lower conductive pads 132. The solder bumps 134 for the external circuit may electrically connect the package substrate 130 to the external circuit. Upper conductive pads 136 may be formed on one side of a top surface of the package substrate 130.

The lower package (e.g., lower package 111a) may include at least one non-memory, that is, a logic semiconductor chip 110a. The semiconductor chip 110a may include first chip pads 112a disposed on an edge of a top surface thereof. The first chip pads 112a may be electrically connected to the upper conductive pads 136 of the package substrate 130 by first bonding wires 150a.

The upper package (e.g., upper packages 111b and 111c) may include a plurality of memory semiconductor chips 110b and 110c. The plurality of memory semiconductor chips 110b and 110c may be vertically stacked and include second and third chip pads 112b and 112c disposed on edges of top surfaces thereof. Thus, the memory semiconductor chips 110b and 110c may be connected to the upper conductive pads 136 of the package substrate 130 by second and third bonding wires 150b and 150c, respectively. Adhesive members 140a, 140b, and 140c may be interposed between the package substrate 130 and the semiconductor chip 110a or between the semiconductor chips 110a, 110b, and 110c. The semiconductor chip 110c stacked on the top of the upper package (e.g., upper package 111c) may further include thermal pads 120 arranged in a lattice shape in width and lengthwise directions.

The molding member 160 may include via holes 162, which may be formed through the molding member 160 to expose the thermal pads 120. Thermally conductive via plugs 200 may be formed within the via holes 162 and form contacts along with the thermal pads 120. The via plugs 200 may have a tapered shape such that outer diameters of the via plugs 200 decrease downward from the surface of the molding member 160 to the thermal pads 120.

In the case of an MCP in which at least two semiconductor chips are stacked in a single package, since heat generated by a semiconductor chip stacked in a lower portion of the package gradually converges on an upper portion of the package, dissipating heat may be more necessary in a semiconductor chip disposed in the upper portion of the package. In particular, in a system-in-package in which at least two kinds of semiconductor chips are stacked, dissipating heat may be desirable due to a logic memory semiconductor chip with increased power consumption.

Thus, in addition to the via plugs 200, the semiconductor package 100c may include thermally conductive sub-plugs 300 disposed between the via plugs 200 so as not to form contacts along with the thermal pads 120. In this case, the sub-plugs 300 may be continuously formed in the widthwise direction or lengthwise direction. In the exemplary embodiments of the present general inventive concept illustrated in FIGS. 5A-5B, each of the sub-plugs 300 may have a dam or fence shape.

When the via plugs 200 are connected by the sub-plugs 300 as described above, an area occupied by the via plugs 200 and the sub-plugs 300 in the entire area of the molding member 160 may be increased more than when heat dissipation is attempted using only the via plugs 200. When the sub-plugs 300 are continuously formed, a heat dissipation effect may be increased and/or improved more than when the sub-plugs 300 are discontinuously formed. For example, when the semiconductor package 100c includes only the via plugs 200, an occupation rate of the via plugs 200 may be only about 30%. However, when the via plugs 200 are bridged using the sub-plugs 300 and continuously formed, the occupation rate of the via plugs 200 and the sub plugs 300 may be as high as about 80%.

Hereinafter, methods of manufacturing a semiconductor chip and a semiconductor package including a semiconductor chip according to exemplary embodiments of the present general inventive concept will be described.

A method of manufacturing a semiconductor chip will now be described in connection with exemplary embodiments of the general inventive concept. FIGS. 6A through 6D are longitudinal sectional views illustrating a method of manufacturing a semiconductor chip according to exemplary embodiments of the present general inventive concept.

Figure 6A:
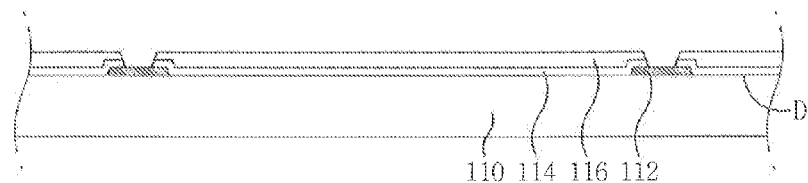
FIGS. 6A through 6D are longitudinal sectional views illustrating a method of manufacturing a semiconductor chip according to exemplary embodiments of the present general inventive concept.

Referring to FIG. 6A, a semiconductor chip 110 may be prepared. The semiconductor chip 110 may be a wafer-level chip on which a sawing process, which is a semiconductor manufacturing process, has not been performed yet. In addition to a semiconductor circuit (although not illustrated in FIG. 6A, the semiconductor circuit may be similar to the semiconductor chip 110 illustrated in FIGS. 1B, 2B, 2D, 2F, 2H, 3B, 4B, and/or semiconductor chips 110a, 110b, and 110c illustrated in FIG. 5B), chip pads 112, a passivation layer 114, and a first buffer layer 116 may be further formed on a first surface D of the semiconductor chip 110 using an ordinary wafer manufacturing process. The chip pads 112 may function as I/O (input/output) terminals of the semiconductor circuit, and the passivation layer 114 may cover the first surface D of the semiconductor chip 110 except the chip pads 112.

To protect the semiconductor circuit of the semiconductor chip 110, the passivation layer 114 may cover the entire first surface D of the semiconductor chip 110 to open the chip pads 112. The passivation layer 114 may be a silicon oxide layer or a silicon nitride layer. The chip pads 112 may be formed of copper (Cu) or a metal compound including Cu.

The first buffer layer 116 may function as an electrical insulator and as a buffer configured to reduce thermal stress. The first buffer layer 116 may be formed of a polymer using a coating process. Alternatively, the first buffer layer 116 may be formed of photosensitive polyimide using a photolithography process. The first buffer layer 116 may be partially removed to cover the passivation layer 114 and expose the chip pads 112.

Figure 6B:
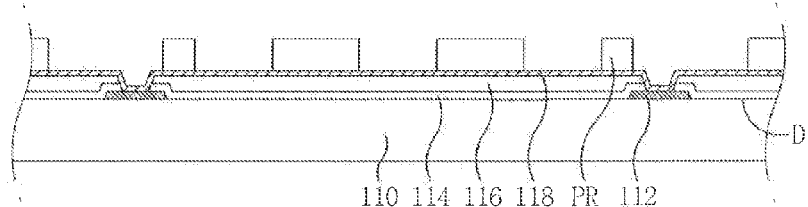

Referring to FIG. 6B, a seed layer 118 may be formed on the first buffer layer 116 using a metal plating process or a physical deposition process. The seed layer 118 may be used as an electrode to form thermal pads (refer to thermal pads 120 in FIG. 6C). The thermal pads 120 may be formed using a plating process or deposition process depending on the type of a metal material. In exemplary embodiments of the present general inventive concept, the seed layer 118 may be formed when the plating process is performed. However, the formation of the seed layer 118 may be omitted when the deposition process is performed. A resist layer may be formed on the seed layer 118 and selectively removed using exposure and developing processes, thereby forming a resist pattern PR to expose a portion of the seed layer 118.

Figure 6C:
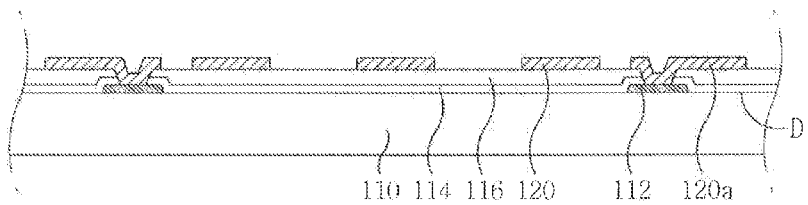

Referring to FIG. 6C, an electroplating process may be performed using the seed layer 118 exposed by the resist pattern PR as an electrode, thereby forming thermal pads 120 and re-distribution pads 120a. The resist pattern PR may be removed, and the seed layer 118 may be removed using the thermal pads 120 and the re-distribution pads 120a as an etch mask. The seed layer 118 is omitted in FIG. 6 because it is assumed that the seed layer 118 is absorbed into the thermal pads 120.

Figure 6D:
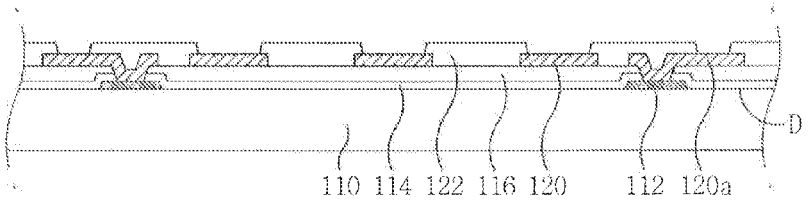

Referring to FIG. 6D, a second buffer layer 122 may be formed on the first buffer layer 116. The second buffer layer 122 may be formed of polyimide using a coating process. Since polyimide is capable of a photolithography process, a portion of the second buffer layer 122 may be removed using exposure and developing processes, thereby exposing the thermal pads 120 and the re-distribution pads 112a.

Hereinafter, a method of manufacturing a semiconductor package of the semiconductor chip manufactured by the method of FIGS. 6A through 6D will be described.

FIGS. 7A through 7H are longitudinal sectional views illustrating a method of manufacturing a semiconductor package according to exemplary embodiments of the present general inventive concept. A method of manufacturing the semiconductor package illustrated in FIGS. 1A-2H will be chiefly described.

Figure 7A:
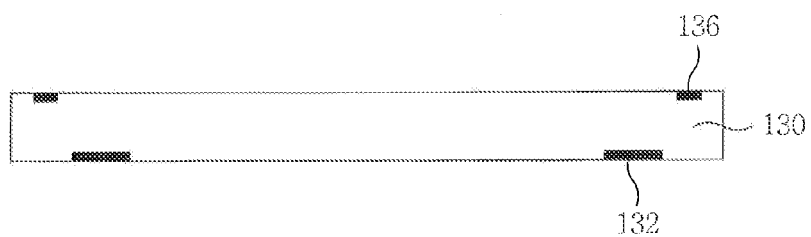
FIGS. 7A through 7H are longitudinal sectional views illustrating a method of manufacturing a semiconductor package according to exemplary embodiments of the present general inventive concept.

Referring to FIG. 7A, a package substrate 130 may be prepared. The package substrate 130 may include lower conductive pads 132 disposed on one side of a bottom surface thereof and upper conductive pads 136 disposed on one side of a top surface thereof. The package substrate 130 may include a PCB or a lead frame. The package substrate 130 may be manufactured using a known manufacturing technique.

Figure 7B:
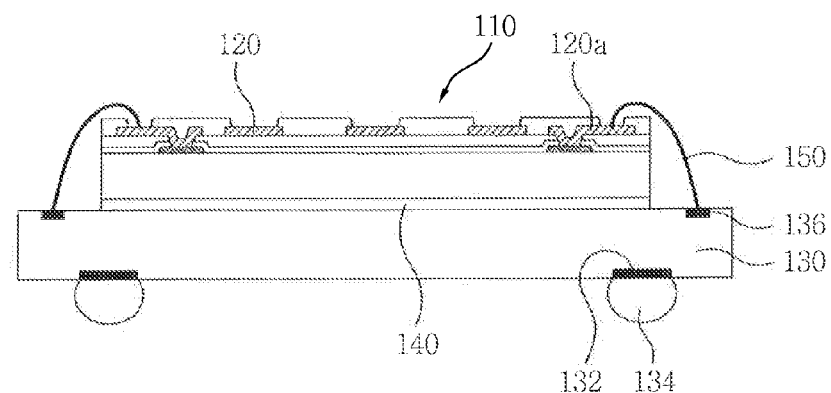

Referring to FIG. 7B, the semiconductor chip 110 may be physically attached to the package substrate 130 using an adhesive member 140. The semiconductor chip 110 may be obtained by sawing a wafer-level semiconductor chip manufactured by the method of FIGS. 6A through 6D. The upper conductive pads 136 of the package substrate 130 may be electrically connected to the re-distribution pads 120a of the semiconductor chip 110 using a connection member 150. The adhesive member 140 may include an adhesive sheet. The connection member 150 may include gold wires.

Figure 7C:
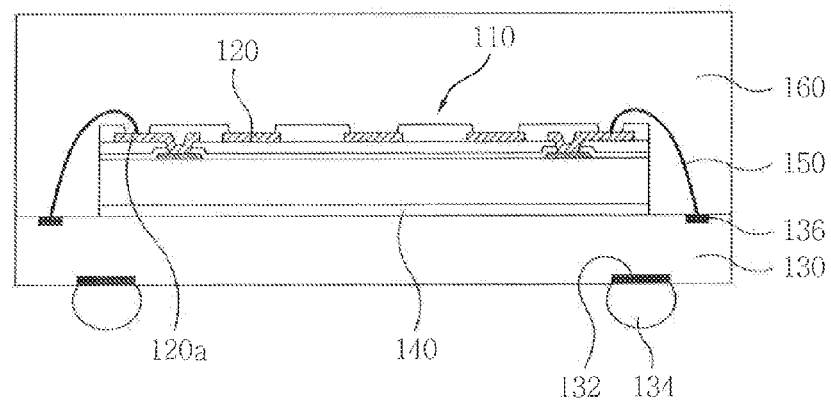

Referring to FIG. 7C, a molding member 160 may be formed on the package substrate 130 including the semiconductor chip 110 and the connection member 150. The molding member 160 may seal at least the semiconductor chip 110 and the connection member 150 so that the semiconductor chip 110 and the connection member 150 can be chemically or physically protected from external environments. The molding member 160 may include a resin-based mixture or epoxy molding compound (EMC). Solder bumps 134 to connect to an external circuit may be attached to the lower conductive pads 132 of the package substrate 130. Alternatively, after the solder-ball mount process and the solder-ball reflow process are finished, the solder bumps 134 to connect the external circuit may be attached to the lower conductive pads 134.

Figure 7D:
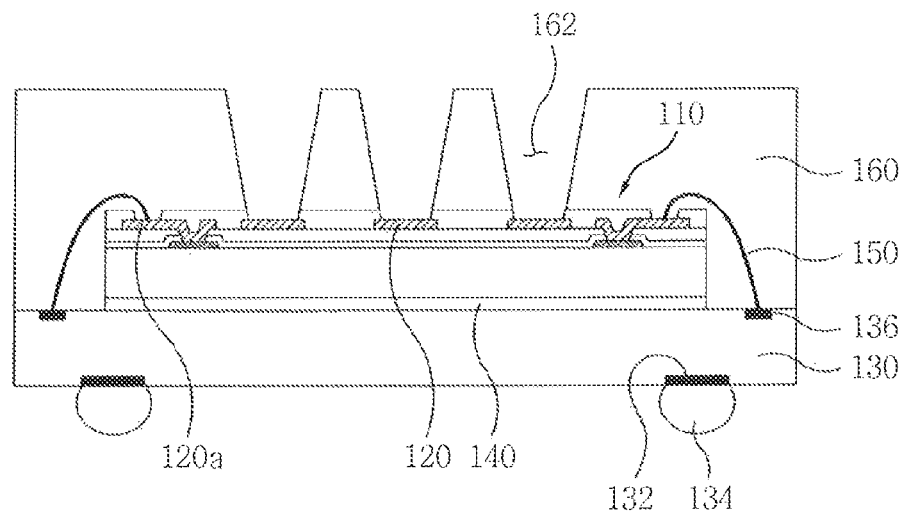

Referring to FIG. 7D, a portion of the molding member 160 may be removed to form via holes 162 exposing thermal pads 120. The via holes 162 may be simultaneously or separately formed using a via process. The via process may be an etch process including a mask process or a photo process. The via process may be a laser drilling process without a mask process or a photo process. The maser drilling process may facilitate setting the size and depth of the via holes 162. The via process may be a mechanical process using a drill bit. The via holes 162 may be formed using a mold during the molding of the molding member 160.

The laser drilling process may be performed using a laser (e.g., an excimer laser). The focus of laser beams may be adjusted to a top surface of the molding member 160 to align the laser beams with the thermal pads 120. The molding member 160 may be drilled due to irradiation of the laser beams. The via holes 162 may be formed in a roughly circular shape on the top surface of the molding member 160. The inner diameter of the via holes 162 may decrease downward from the top surface of the molding member 160 to the thermal pads 120. Since the focus of the laser beams is adjusted to the top surface of the molding member 160, the focus of the laser beams may be adjusted less toward a lower portion of the molding member 160. Thus, the intensity of the laser beams may be reduced and the removed extent of the molding member 160 may be reduced toward the lower portion of the molding member 160.

Even if the focus of the laser beams is not adjusted, since the diameter of a lower portion of the via hole 162 is less than that of an upper portion thereof, a probability that the via hole 162 is misaligned with the thermal pad 120 may be reduced. When the focus of the laser beams is adjusted above the top surface of the molding member 160 or irradiated at a predetermined low intensity, the via hole 162 may not expose the thermal pad 120. Therefore, the focus and intensity of the laser beams may be determined so that the via hole 162 may expose at least the thermal pad 120. The thermal pad 120 may prevent a semiconductor circuit from being damaged by the laser beams. Accordingly, the thermal pad 120 may have a circular or similar sectional shape corresponding to the via hole 162.

Figure 7E:
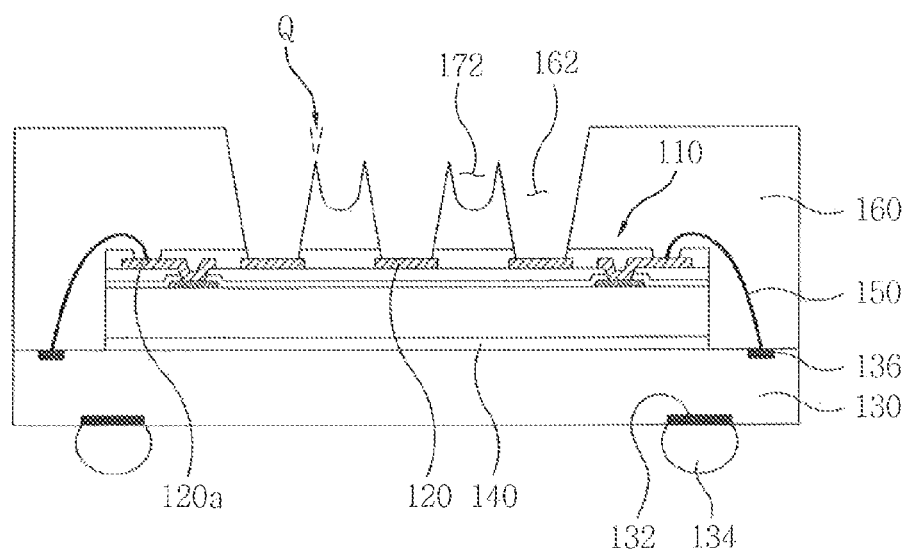

Referring to FIG. 7E, sub-holes 172 may be formed between the adjacent via holes 162. In this case, the intensity of laser beams may be determined to have a range so as not to penetrate the molding member 160. Alternatively, the focus of the laser beams may be adjusted above the top surface of the molding member 160. Similarly, since the focus of the laser beams is adjusted less toward the lower portion of the molding member 160, the inner diameter of the sub-hole 172 may decrease downward from the top surface of the molding member 160.

Upper portions of the tapered via hole 162 and sub-hole 172 may partially overlap each other. An upper portion of the molding member 160 disposed at an interface Q where the via hole 162 and the sub-hole 172 overlap each other may be at a lower level than the top surface of the molding member 160. Since the upper portion of the molding member 160 disposed at the interface Q is at the lower level than the top surface of the molding member 160, a solder material (refer to solder material 170 of FIG. 7F) melted during a subsequent process may flow through the interface Q between the adjacent via hole 162 and sub-hole 172 and be then solidified at room temperature to function as a connection (refer to S of FIG. 7G).

Figure 7F:
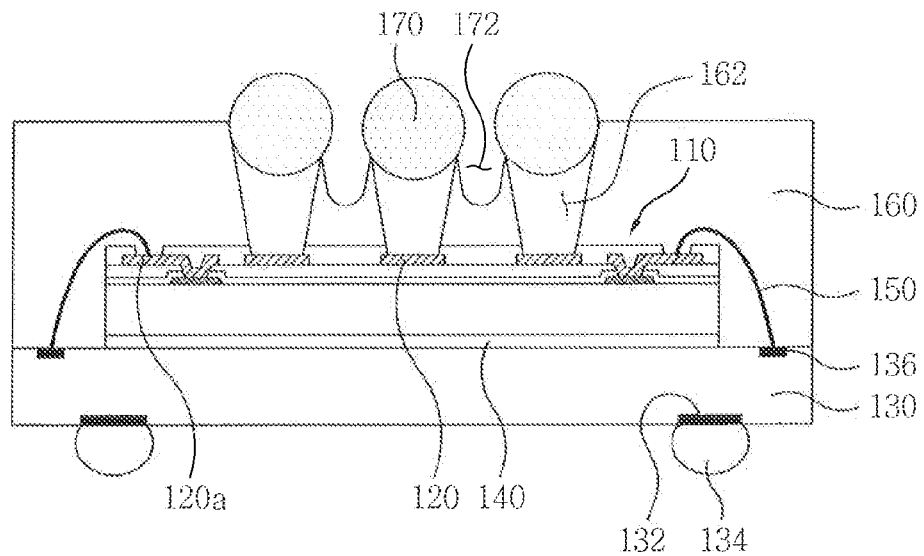

Referring to FIG. 7F, a solder-material mount process may be performed using a solder-ball mount tool. The solder material 170 may be a spherical or similar solder ball. Solder materials 170 may be arranged in the via holes 162, respectively. The solder materials 170 may have a predetermined flowability and contain a metal or solder paste that has increased thermal conductivity. The volume of the solder material 170 may be at least greater than that of the via hole 162. The volume of the solder material 170 may be equal to or less than the sum of the volume of the via hole 162 and the volume of the sub-hole 172 disposed adjacent to the via hole 162.

Figure 7G:
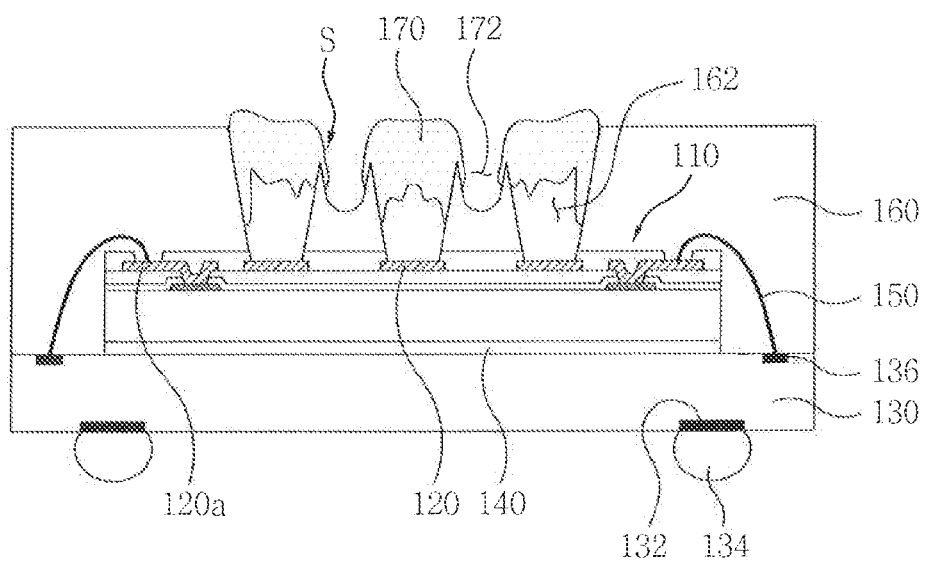

Referring to FIG. 7G, the solder-material reflow process may be performed using a reflow apparatus to perform heating and cooling. When heat is applied to the solder materials 170 using a reflow process, the solder materials 170 may be melted to fill each of the via holes 162. Since the solder material 170 contains tin/lead (Sn/Pb) or contains a mixture of Sn as a principal component with silver (Ag), copper (Cu), or zinc (Zn) instead of Pb, the solder material 170 may be melted at a temperature of about 200 to 300° C. In this case, the melted solder materials 170 filling the via holes 162 may overflow into the adjacent sub-holes 172 and fill the sub-holes 172. Since the solder materials 170 filling the via holes 162 and the sub-holes 172 are in a melted state, the via holes 162 and the sub-holes 172 may be connected to each other due to surface tension. In particular, since the upper portions of the via holes 162 and the sub-holes 172 partially overlap each other and upper portions of the molding member 160 disposed at the interfaces Q (illustrated in FIG. 7E) where the via holes 162 overlap the sub-holes 172 are at a lower level than the top surface of the molding member 160, the melted solder materials 170 may be easily connected to one another due to the surface tension.

Figure 7H:
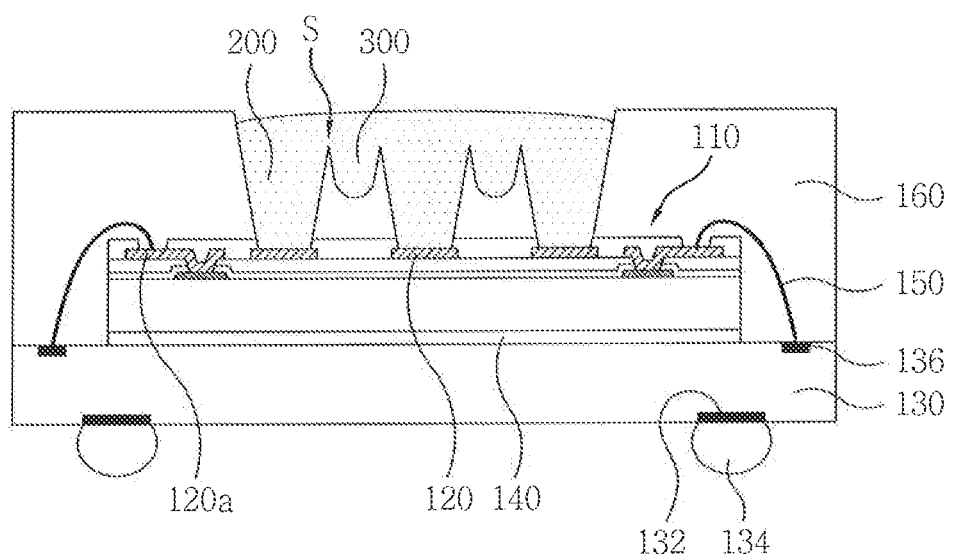

Referring to FIG. 7H, the melted solder materials 170 may be cooled and solidified at room temperature. In this case, the via holes 162 and the sub-holes 172 may be molds of the melted solder materials 170. The solidified solder materials 170 may become via plugs 200 and sub-plugs 300, which may be integrally connected to each other. By integrally connecting the thermally conductive via plugs 200 and the sub-plugs 300, a heat transmission path may be expanded, and thermal diffusion may be enabled.

When the thermally conductive via plugs 200 are formed using the solder material 170, the thermally conductive via plugs 200 may have a thermal conductivity of 40 W/mk or higher. In comparison, when the molding member 160, which is formed of an epoxy resin, has a predetermined very high resistance and an insulation characteristic, the molding member 160 may have a predetermined thermal conductivity of 2 W/mk or lower. However, when the thermally conductive via plugs 200 are formed in the molding member 160, since the via plugs 200 may function as a path through which heat generated by the semiconductor chip 110 is transmitted or diffused, heat may be dissipated. When the solder material 170 is manufactured using metal balls, such as aluminum (Al) balls or Cu balls, the via plugs 200 may have a thermal conductivity of 100 W/mk or higher.

Although the thermally conductive via plugs 200 and the sub-plugs 300 are described above as being respectively formed in the via holes 162 and the sub-holes 172 using a solder-material mount process and a solder-material reflow process, the thermally conductive via plugs 200 may be plated with a conductive metal. Also, the via plugs 200 may be formed of a conductive paste using a stencil printing process.

Figure 8A:
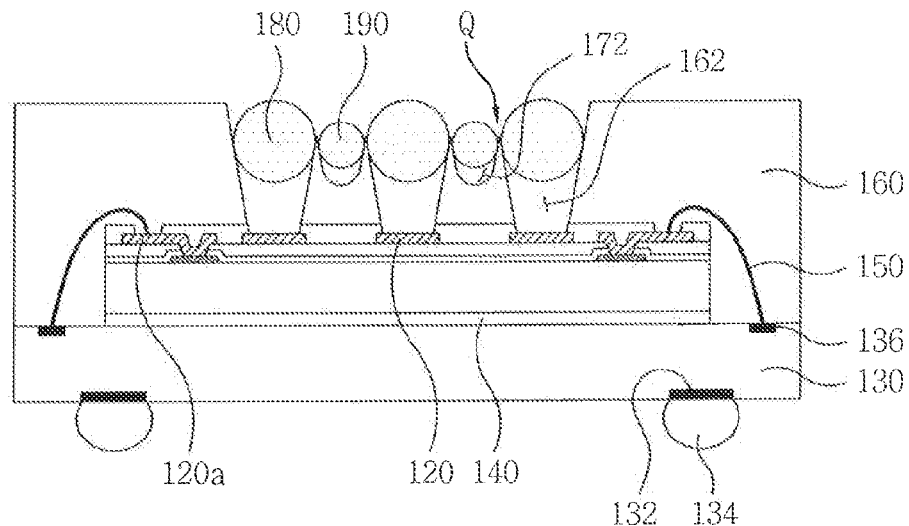
FIGS. 8A and 8B are longitudinal sectional views illustrating a method of manufacturing a semiconductor package according to exemplary embodiments of the present general inventive concept.
Figure 8B:
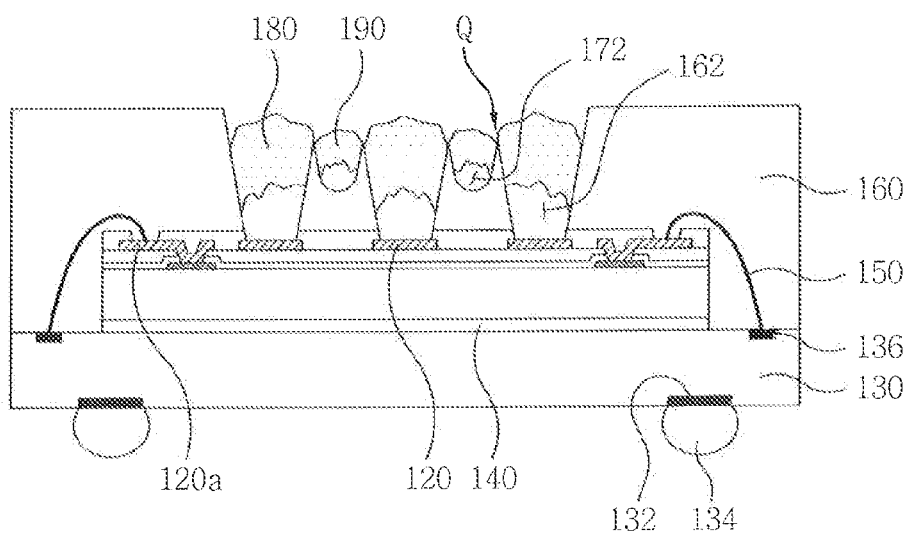

As the method illustrated in FIGS. 8A-8B is similar to the method illustrated in FIGS. 7A-7H, only differences therebetween will now be described. Thus, a description of the same components as illustrated in FIGS. 7A-7H and described above will be omitted, and the same names and reference numerals are used to denote the same components.

Referring to FIG. 8A, a semiconductor chip 110 may be adhered using an adhesive member 140 to a top surface of a package substrate 130 including lower conductive pads 132 and upper conductive pads 136. The semiconductor chip 110 may be electrically connected to the package substrate 130 using a connection member 150 and molded by a molding member 160. Solder bumps 134 to connect an external circuit may be attached to the lower conductive pads 132. Also, via holes 162 may be formed in the molding member 160 to expose thermal pads 120, and sub-holes 172 may be further formed between adjacent via holes 162 not to expose the semiconductor chip 110. The tapered via holes 162 may partially overlap the tapered sub-holes 172 at an interface Q therebetween.

The solder materials 180 and 190 may be prepared according to the kinds of the via holes 162 and the sub-holes 172. For example, solder materials may be divided into the first solder balls 180 corresponding to the via holes 162 and the second solder balls 190 corresponding to the sub-holes 172. The volume of the first solder balls 180 may be equal to or smaller than that of the via holes 162. Similarly, the volume of the second solder balls 190 may be equal to or smaller than that of the sub-holes 162.

Referring to FIG. 8B, when heat is applied to the first solder balls 180 and the second solder balls 190 using a reflow process, the first solder balls 180 may melt to fill the via holes 162, and the second solder balls 190 may melt to fill the sub-holes 172. Since the first solder balls 180 filled in the via holes 162 and the second solder balls 190 filled in the sub-holes 172 are in a melted state, the first solder balls 180 and the second solder balls 190 may be connected to each other by the interface Q due to surface tension. When the melted first and second solder balls 180 and 190 are cooled and solidified, the thermally conductive via plugs 200 may be integrally connected to the sub-plugs 300.

Figure 9A:
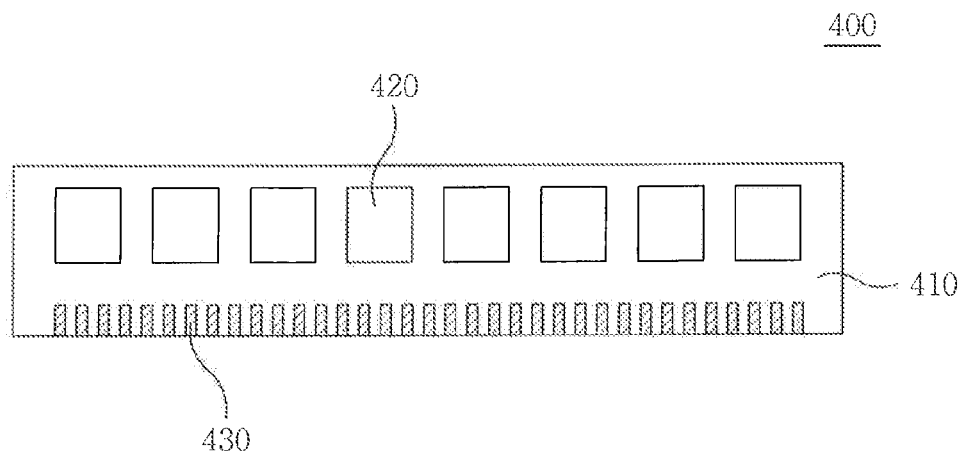
FIGS. 9A through 9C are block diagrams illustrating a semiconductor module, electronic system, and memory card including various semiconductor packages according to exemplary embodiments of the present general inventive concept.
Figure 9B:
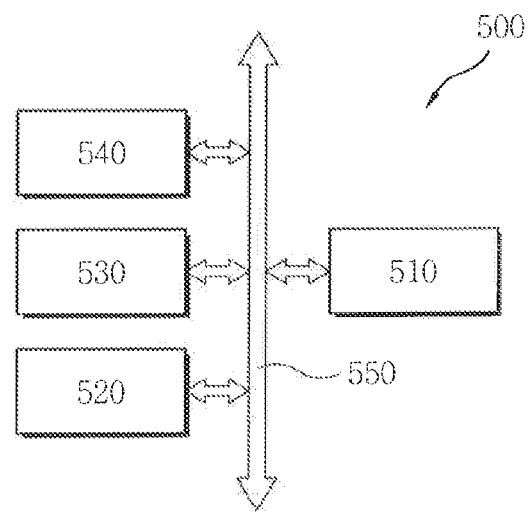
Figure 9C:
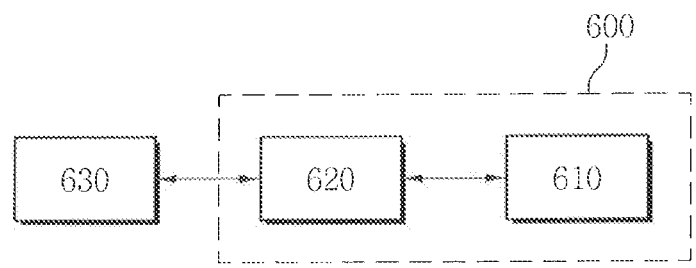

FIGS. 9A through 9C are block diagrams illustrating a semiconductor module, electronic system, and memory card including various semiconductor packages according to exemplary embodiments of the present general inventive concept.

Referring to FIG. 9A, each of the semiconductor packages 100, 100a, 100b, and 100c according to the above-described exemplary embodiments may be applied to a semiconductor module 400 including various kinds of semiconductor devices (e.g., memory devices and non-memory devices). The semiconductor module 400 may include a module substrate 410, semiconductor integrated circuit (IC) chips 420 mounted on the module substrate 410, and module contact terminals 430 disposed in a row on one side of the module substrate 410 and electrically connected to the semiconductor IC chips 420. The semiconductor IC chips 420 may be applied to a package technique according to the exemplary embodiments of the present general inventive concept as described herein. The semiconductor module 400 may be connected to an external electronic device through the module contact terminals 430.

Referring to FIG. 9B, each of the semiconductor packages 100, 100a, 100b, and 100c may be applied to an electronic system 500. The electronic system 500 may include a controller 510, an I/O (input/output) device 520, and a memory device 530. The controller 510, the I/O device 520, and the memory device 530 may be combined with one another through a bus 550. The bus 550 may provide a path through which data may be received and transmitted. The controller 510 may include at least one of at least one microprocessor (MP), a digital signal processor, a micro-controller, and logic devices capable of similar functions to the MP, digital signal processor, and micro-controller Each of the controller 510 and the memory device 530 may include at least one of the semiconductor packages 100, 100a, 100b, and 100c according to the exemplary embodiments of the present general inventive concept as described herein. The I/O unit 520 may include at least one of a keypad, a keyboard, and a display device. The memory device 530 may store data and/or commands to be executed by the controller 510. The memory device 530 may include a volatile memory device, such as a DRAM (Dynamic Random Access Memory), and/or a nonvolatile memory device, such as a flash memory device. For example, a flash memory device may be mounted on a data processing system, such as a mobile device or a desktop computer. The flash memory device may include a semiconductor disc device (SDD).

The electronic system 500 may include an interface 540 configured to transmit data via a communication network or receive the data from the communication network. The interface 540 may be a wired and/or wireless interface. For example, the interface 540 may include an antenna or a wired/wireless transceiver. The electronic system 500 may be a mobile system, a personal computer (PC), an industrial computer, or a logic system having various functions. For instance, the mobile system may be at least one of a personal digital assistant (PDA), a portable computer, a web tablet, a mobile phone, a wireless phone, a laptop computer, a memory card, a digital music system, and a data transmitter/receiver system.

Referring to FIG. 9C, each of semiconductor packages 100, 100a, 100b, and 100c according to the above-described exemplary embodiments may be provided in the type of a memory card 600. For example, the memory card 600 may include a nonvolatile memory device 610 and a memory controller 620. The nonvolatile memory device 610 and the memory controller 620 may store data or read stored data. The nonvolatile memory device 610 may include at least one of nonvolatile memory devices to which a semiconductor package technique according to the inventive concept is applied. The memory controller 620 may control the nonvolatile memory device 610 in response to read/write requests of a host 630 to read the stored data or store the data.

In addition, the names and functions of non-illustrated or undescribed components may be easily understood with reference to other drawings of the present specification and descriptions thereof.

The above-described semiconductor package of semiconductor chips according to the embodiments of the inventive concept may have the following merits. First, the via hole may be simply formed using a laser drilling process appropriate for the processing of an EMC. Second, since solder balls having a low melting point are used, the semiconductor circuit may be prevented from being damaged due to heat during a reflow process. Third, the thermal pads are initially formed during the manufacture of the semiconductor chip so that thermally conductive plugs may be tightly fixed to the EMC during a package process. Fourth, adjacent via plugs may be bridged using sub-plugs, thereby maximizing a heat dissipation area.

The foregoing is illustrative of exemplary embodiments of the present general inventive concept and is not to be construed as limiting thereof. Although several embodiments have been described, those skilled in the art will readily appreciate that many modifications are possible in embodiments without materially departing from the novel teachings and advantages. Accordingly, all such modifications are intended to be included within the scope of this inventive concept as defined in the claims. In the claims, means-plus-function clauses are intended to cover the structures described herein as performing the recited function, and not only structural equivalents but also equivalent structures. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

What is claimed is:

1. A method of manufacturing a semiconductor device, comprising:
    mounting a semiconductor chip on a package substrate;
    forming a molding member on the semiconductor chip;
    forming via holes penetrating the molding member to expose a portion of a top surface of the semiconductor chip, the via holes being arranged in a lattice shape in a plan view;
    forming sub-holes between the via holes, the sub-holes being not to expose the top surface of the semiconductor chip; and
    forming thermally conductive via plugs in the via holes.

2. The method of claim 1, wherein the forming the via holes comprises removing portions of the molding member by laser drilling process.

3. The method of claim 1, wherein the forming the thermally conductive via plugs comprises filling the via holes with a solder material using a reflow process.

4. The method of claim 1, further comprising:
    forming thermally conductive sub-plugs in the sub-holes.

5. The method of claim 4, wherein the thermally conductive sub-plugs bridge at least two of the thermally conductive via plugs.

6. The method of claim 4, wherein at least two of the thermally conductive sub-plugs are formed between the thermally conductive via plugs.

7. The method of claim 1, further comprising:
    forming thermal pads on the semiconductor chip to be in contact with the thermally conductive via plugs.

8. The method of claim 7, further comprising:
    forming a chip pad on the semiconductor chip not to be in contact with the thermally conductive via plugs.

9. The method of claim 8, further comprising:
    forming an upper conductive pad on the package substrate, the upper conductive pad being electrically connected with the chip pad via a connection member.

10. The method of claim 7, wherein at least two of the thermally conductive via plugs are in contact with one of the thermal pads.

11. The method of claim 10, wherein the chip pad is formed at same level as the thermal pad.

12. The method of claim 1, wherein the via holes has a tapered shape such that an inner diameter of the holes decreases toward the thermal pads.

13. The method of claim 1, wherein a top surface of the thermally conductive via plugs is lower than a top surface of the molding member.

14. A method of manufacturing a semiconductor package, comprising:
    mounting a semiconductor chip having a plurality of thermal pads on a package substrate;
    forming a molding member to cover the semiconductor chip on the package substrate;
    forming a plurality of holes in the molding member, at least one of the plurality of holes exposing the thermal pads;
    mounting thermally conductive materials on the plurality of holes; and
    reflowing the thermally conductive materials to fill the plurality of holes with thermally conductive via plugs.

15. The method of claim 14, wherein the forming the thermal pads on the semiconductor chip comprises:
    forming chip pads on the semiconductor chip;
    forming a passivation layer and a first buffer layer on the semiconductor circuit to expose the chip pads;
    forming the thermal pads on the first buffer layer; and
    forming a second buffer layer on the first buffer layer to expose the thermal pads.

16. A method of manufacturing a semiconductor package, comprising:
    preparing a package substrate having an upper conductive pad thereon;
    mounting a semiconductor chip having a thermal pad and a chip pad;
    electrically connecting the upper conductive pad with the chip pad via a connection member;
    encapsulating the semiconductor chip and the connection member using a molding member;
    forming a via plug penetrating the molding member to be directly in contact with the thermal pad;
    forming a sub-plug in the molding member not to be in contact with the thermal pad,
    wherein the via plug and the sub-plug are materially in continuity with each other.

17. The method of claim 16, wherein the forming the via plug comprises:
    forming a via hole penetrating the molding member to expose the thermal pad and a sub-hole penetrating the molding member not to expose the thermal pad and the chip pad; and
    forming the via plug in the via hole and the sub-plug in the sub-hole by filling the via hole and the sub-hole with solder materials.

18. The method of claim 17, wherein the via hole has a greater depth than the sub-hole.

* * * * *